US009666254B1

(12) United States Patent
Woo

(10) Patent No.: US 9,666,254 B1
(45) Date of Patent: May 30, 2017

(54) SEMICONDUCTOR MEMORY APPARATUS HAVING OPEN BIT LINE STRUCTURE IN WHICH A SENSE AMPLIFIER ARRAY SHARED BETWEEN A DUMMY ARRAY AND NORMAL ARRAY,COMPARING ONE BIT LINE OF THE NORMAL ARRAY WITH TWO OR MORE BIT LINES OF THE DUMMY ARRAY

(71) Applicant: SK hynix Inc., Gyeonggi-do (KR)

(72) Inventor: Jai Yong Woo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/013,433

(22) Filed: Feb. 2, 2016

(30) Foreign Application Priority Data

Nov. 6, 2015 (KR) .......................... 10-2015-0155940

(51) Int. Cl.
*G11C 7/02* (2006.01)
*G11C 8/10* (2006.01)
*G11C 7/06* (2006.01)

(52) U.S. Cl.
CPC ................ *G11C 8/10* (2013.01); *G11C 7/062* (2013.01); *G11C 7/065* (2013.01)

(58) Field of Classification Search
CPC ........ G11C 7/062; G11C 7/065; G11C 11/4091
USPC .............................. 365/208, 149, 51, 63, 200
See application file for complete search history.

(56) References Cited

U.S. PATENT DOCUMENTS

| 5,923,593 | A | * | 7/1999 | Hsu ........................ G11C 8/16 365/149 |
| 7,474,550 | B2 | | 1/2009 | Fujisawa et al. |
| 2006/0181943 | A1 | * | 8/2006 | Kim ...................... G11C 29/816 365/200 |
| 2007/0041260 | A1 | * | 2/2007 | Hong .................. G11C 11/4097 365/208 |
| 2007/0081375 | A1 | * | 4/2007 | Kawakita ............... G11C 5/025 365/63 |
| 2016/0163365 | A1 | * | 6/2016 | Yang ...................... G11C 7/062 365/51 |

* cited by examiner

*Primary Examiner* — Connie Yoha
(74) *Attorney, Agent, or Firm* — IP & T Group LLP

(57) ABSTRACT

A semiconductor memory apparatus may include a memory bank having a plurality of memory cell arrays. The memory bank may have an open bit line structure. A sense amplifier array may be coupled in common with adjacent memory cell arrays. A sense amplifier coupled in common with a dummy array and a normal array may be coupled with one bit line disposed in the normal array and two bit lines disposed in the dummy array.

13 Claims, 2 Drawing Sheets

SEMICONDUCTOR MEMORY APPARATUS HAVING OPEN BIT LINE STRUCTURE IN WHICH A SENSE AMPLIFIER ARRAY SHARED BETWEEN A DUMMY ARRAY AND NORMAL ARRAY,COMPARING ONE BIT LINE OF THE NORMAL ARRAY WITH TWO OR MORE BIT LINES OF THE DUMMY ARRAY

CROSS-REFERENCES TO RELATED APPLICATION

The present application claims priority under 35 U.S.C. §119(a) to Korean application number 10-2015-0155940, filed on Nov. 6, 2015, in the Korean Intellectual Property Office, which is incorporated herein by reference in its entirety.

BACKGROUND

1. Technical Field

Various embodiments of the disclosure relate generally to a semiconductor apparatus and, more particularly, to a semiconductor memory apparatus.

2. Related Art

Generally, a semiconductor memory apparatus such as a dynamic random access memory (RAM) includes a plurality of memory cell arrays. The plurality of memory cell arrays include a plurality of memory cells for storing data. The memory cells may be accessed through controlling word lines and bit lines.

As a semiconductor memory apparatus is highly integrated, it can store a large amount of data in a small area. To further increase the storage capacity more memory cells should be sufficiently secured in the same area, however, this is becoming increasingly more difficult because of the already high degree of integration. Recently, a memory cell array having an open bit line structure has been proposed which may occupy a smaller area than that of a conventional memory cell array having a folded bit line structure, despite having the same data storage capacity as that of the memory cell array having the folded bit line structure.

SUMMARY

Various embodiments of the disclosure are directed to a semiconductor memory apparatus in which a sense amplifier array shared between a dummy array and a normal array may compare one bit line of the normal array with two or more bit lines of the dummy array and sense it.

In an embodiment, a semiconductor memory apparatus may include: a first dummy array disposed at a predetermined portion of a memory bank; a first normal array disposed adjacent to the first dummy array; and a first sense amplifier array coupled in common between the first dummy array and the first normal array, wherein the first sense amplifier array may include a plurality of sense amplifiers, and each of the plurality of sense amplifiers may be coupled with one bit line disposed in the first normal array and two bit lines disposed in the first dummy array.

In an embodiment, a semiconductor memory apparatus may include: a first dummy array disposed at a predetermined portion of a memory bank, and including a first bit line and a second bit line; a first normal array disposed adjacent to the first dummy array, and including a first bit line; and a first sense amplifier coupled with the first and second bit lines of the first dummy array and with the first bit line of the first normal array.

DETAILED DESCRIPTION

Figure 1:
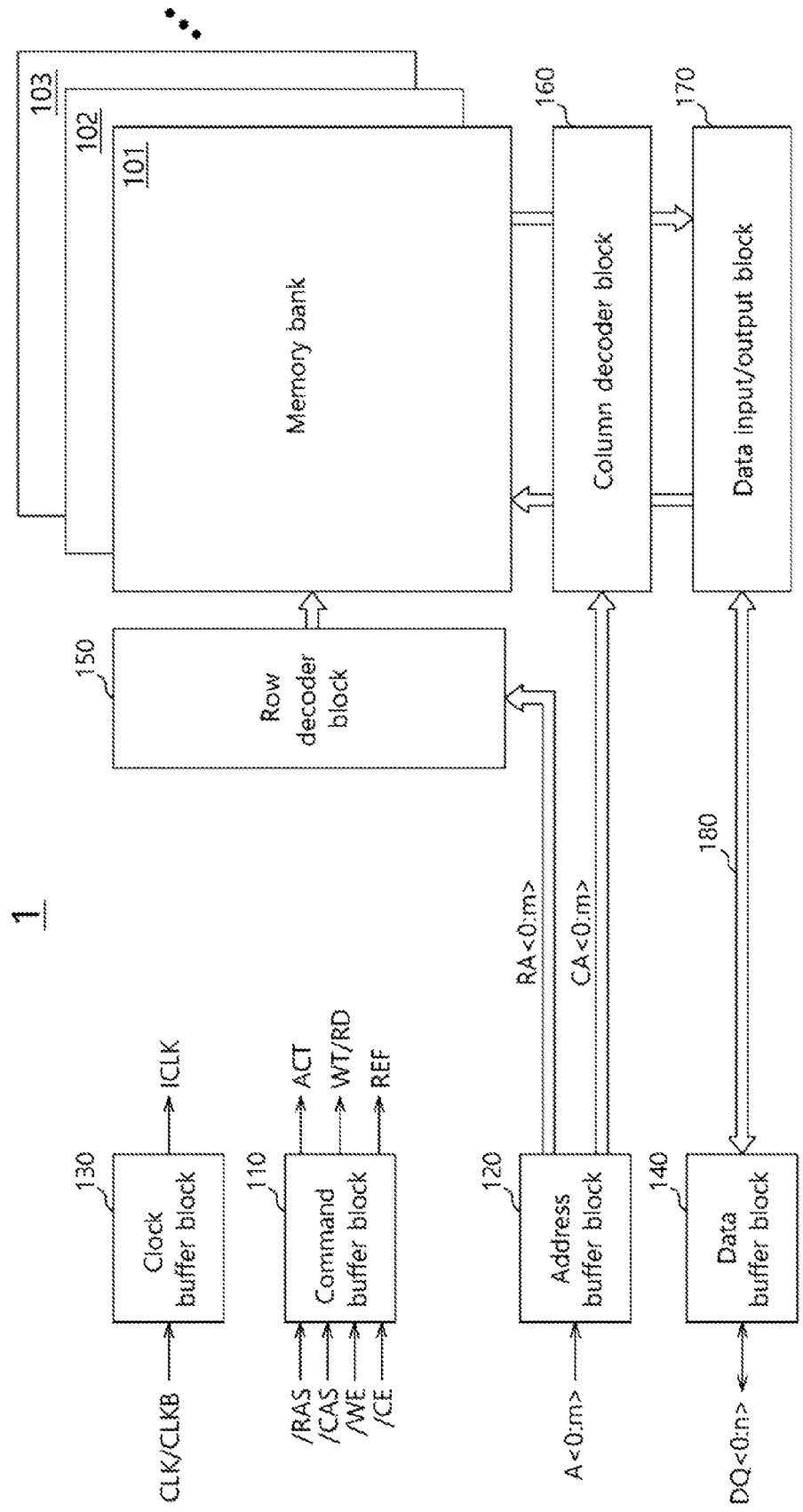
FIG. 1 is a diagram illustrating a semiconductor memory apparatus, according to an embodiment of the invention.

Hereinafter, various embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component.

Referring now to FIG. 1, a semiconductor memory apparatus 1 is provided, according to an embodiment of the invention. The semiconductor memory apparatus 1 may include a volatile memory apparatus. The volatile memory apparatus may include a static random access memory (RAM), a dynamic random access memory (RAM), a synchronous (DRAM), and or the like. The semiconductor memory apparatus 1 may include a nonvolatile memory apparatus. The nonvolatile memory apparatus may include a read only memory (ROM), a programmable ROM (PROM), an erasable programmable ROM (EPROM), an electrically erasable programmable ROM (EEPROM), a phase change RAM (PRAM), a magnetic RAM (MRAM), a resistive RAM (RRAM), a ferroelectric RAM (FRAM), and/or the like.

Referring to FIG. 1, the semiconductor memory apparatus 1 may include a plurality of memory banks 101, 102 and 103. Each of the plurality of memory banks 101, 102 and 103 may include a plurality of memory cell arrays. The memory cell arrays may include a plurality of word lines and a plurality of bit lines. A plurality of memory cells may be coupled at points at which the plurality of word lines and the plurality of bit lines intersect.

The semiconductor memory apparatus 1 may perform various operations. For example, the semiconductor memory apparatus 1 may perform a write operation, a read operation, a refresh operation, and or the like. The semiconductor memory apparatus 1 may store data transmitted from an external apparatus (not shown) such as a host or processor, in the memory banks 101, 102 and 103 during a write operation. The semiconductor memory apparatus 1 may output data stored in the memory banks 101, 102 and 103, to an external apparatus during a read operation. During an operation, the semiconductor memory apparatus 1 may access one or more memory banks at the same time.

The semiconductor memory apparatus 1 may include a command buffer block 110, an address buffer block 120, a clock buffer block 130, and a data buffer block 140. The command buffer block 110 may receive a command signal from an external apparatus and generate various internal command signals. For instance, the command buffer block 110 may receive command signals such as a row address strobe signal/RAS, a column address strobe signal/CAS, a write enable signal/WE, and or a chip enable signal/CE. The external apparatus may change the levels of the row address strobe signal/RAS, the column address strobe signal/CAS, the write enable signal/WE and or the chip enable signal/CE and provide them so that the semiconductor memory apparatus 1 may perform one or more specific operation selected among a plurality of available operations. The command buffer block 110 may decode the row address strobe signal/RAS, the column address strobe signal/CAS, the write enable signal/WE, and/or the chip enable signal/CE and generate various corresponding internal command signals. For example, the command buffer block 110 may generate an active signal ACT, a write signal WT, a read signal RD, a refresh signal REF and or the like. The active signal ACT may be a signal indicating an active operation in which the semiconductor memory apparatus 1 enables a word line. The write signal WT may be a signal indicating a write operation of the semiconductor memory apparatus 1. The read signal RD may be a signal indicating a read operation of the semiconductor memory apparatus 1. The refresh signal REF may be a signal indicating an auto refresh operation and or a self-refresh operation of the semiconductor memory apparatus 1.

The address buffer block 120 may receive an address signal A<0:m> (where m is an integer of 1 or more) from an external apparatus. The address signal A<0:m> may be information for selecting a specific memory cell from the memory banks 101, 102 and 103. The address signal A<0:m> may include, for example, information for accessing a word line and a bit line. The address buffer block 120 may receive the address signal A<0:m> and output the address signal A<0:m> as a row address signal RA<0:m> or a column address signal CA<0:m>, according to the operation of the semiconductor memory apparatus 1.

The clock buffer block 130 may receive a system clock signal CLK/CLKB from an external apparatus. The clock buffer block 130 may buffer the system clock signal CLK/CLKB and generate an internal clock signal ICLK. The clock buffer block 130 may include a delay unit, a delay locked loop, and or the like for adjusting phase and timing of the clock.

The data buffer block 140 may receive data DQ<0:n> (where n is an integer of 1 or more) transmitted from an external apparatus. The data buffer block 140 may output data stored in the memory banks 101, 102 and 103 of the semiconductor memory apparatus 1, to an external apparatus. The data buffer block 140 may include a receiver for receiving data DQ<0:n> transmitted from an external apparatus through an external data bus. The data buffer block 140 may include a transmitter for transmitting data read from the memory banks 101, 102 and 103 to an external data bus. Although not shown, the data buffer block 140 may receive and transmit (i.e. output) a data strobe signal. The data strobe signal may be synchronized with data DQ<0:n>. The data strobe signal may allow the semiconductor memory apparatus 1 and an external apparatus to transmit and/or receive data to and from each other.

The semiconductor memory apparatus 1 may include a row decoder block 150, a column decoder block 160 and a data input/output block 170. The row decoder block 150 may receive a row address signal RA<0:m> from the address buffer block 120. The row decoder block 150 may decode the row address signal and select a word line to be accessed among the plurality of word lines in the memory banks 101, 102 and 103.

The column decoder block 160 may receive a column address signal CA<0:m> from the address buffer block 120. The column decoder block 160 may decode the column address signal CA<0:m> and select a bit line to be accessed among the plurality of bit lines in the memory banks 101, 102 and 103.

The data input/output block 170 may be coupled between the data buffer block 140 and the memory banks 101, 102 and 103. The data buffer block 140 and the data input/output block 170 may be coupled to each other by an internal data bus 180. In a write operation, the data input/output block 170 may store data transmitted from the data buffer block 140 through the internal data bus 180, in a specific memory cell according to selection of a word line and a bit line. In a read operation, the data input/output block 170 may output data outputted from a specific memory cell according to selection of a word line and a bit line, to the data buffer block 140 through the internal data bus 180.

Figure 2:
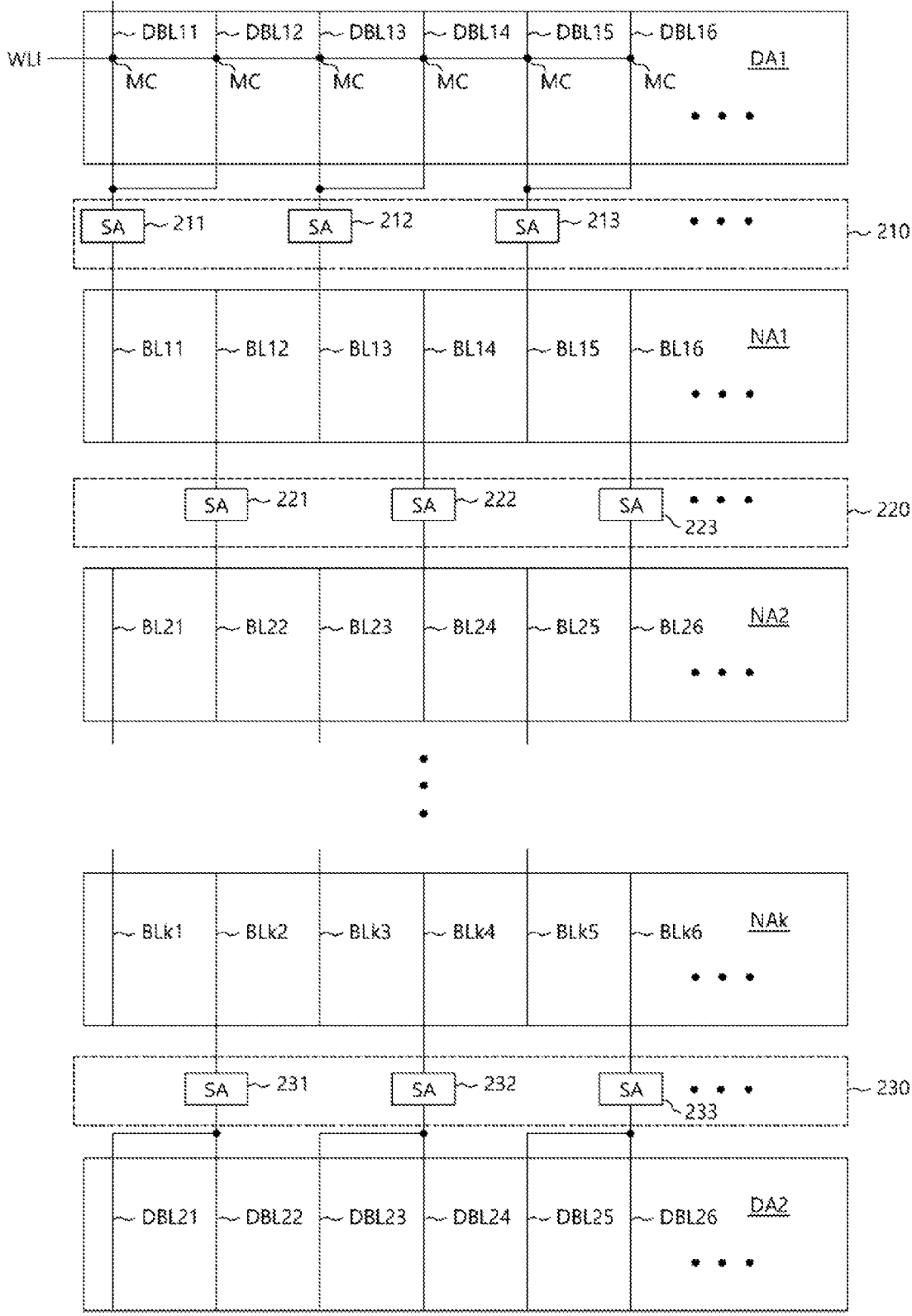
FIG. 2 is a diagram illustrating a memory bank for a semiconductor memory apparatus, according to an embodiment of the invention.

FIG. 2 illustrates a memory bank 201, according to an embodiment of the invention. For example, the memory bank 201 of FIG. 2 may be any one of the plurality of memory banks 101, 102 and 103 of FIG. 1.

Referring to FIG. 2, the memory bank 201 may include a plurality of memory cell arrays. The plurality of memory cell arrays may be successively arranged, and constitute one memory bank. A plurality of word lines and a plurality of bit lines may be disposed in each of the plurality of memory cell arrays. A plurality of memory cells may be disposed at positions at which the plurality of word lines and the plurality of bit lines intersect. A first dummy array DA1 may be disposed at an outermost portion of the memory bank 201. In some embodiments, the first dummy array DA1 may be disposed at a top end of the memory bank 201. A second dummy array DA2 may be disposed at an outermost portion opposite to the first dummy array DA1. In some embodiments, the second dummy array DA2 may be disposed at a bottom end of the memory bank 201. A plurality of normal arrays NA1, NA2 and NAk (where k is an integer of 3 or more) may be successively disposed between the first and second dummy arrays DA1 and DA2. In some embodiments, the first normal array NA1 may be disposed adjacent to the first dummy array DA1. The second normal array NA2 may be disposed adjacent to the first normal array NA1. A k-th normal array NAk may be disposed adjacent to the second dummy array DA2.

Sense amplifier arrays 210, 220 and 230 may be respectively disposed between the dummy arrays DA1 and DA2 and the normal arrays NA1, NA2 and NAk that are adjacent to each other. Each of the sense amplifier arrays 210, 220 and 230 may be coupled to bit lines of adjacent memory cell arrays and amplify voltage levels of the bit lines which vary depending on data stored in the corresponding memory cells. The memory bank 201 may have an open bit line structure wherein the sense amplifier arrays 210, 220 and 230 are coupled in common with the bit lines of the adjacent memory cell arrays.

The first sense amplifier array 210 may be disposed between the first dummy array DA1 and the first normal array NA1 and coupled in common with bit lines of the first dummy array DA1 and bit lines of the first normal array NA1. The second sense amplifier array 220 may be disposed between the first normal array NA1 and the second normal array NA2 and coupled in common with bit lines of the first normal array NA1 and bit lines of the second normal array NA2. The third sense amplifier array 230 may be disposed between the second dummy array DA2 and the k-th normal array NAk and coupled in common with bit lines of the second dummy array DA2 and bit lines of the k-th normal array NAk.

Each of the first dummy array DA1, the second dummy array DA2, the first normal array NA1, the second normal array NA2 and the k-th normal array NAk may include a plurality of bit lines. Each of the first sense amplifier array 210, the second sense amplifier array 220 and the third sense amplifier array 230 may include a plurality of sense amplifiers SA. Each of the plurality of sense amplifiers SA 211-213 of the first sense amplifier array 210 may be coupled with one bit line disposed in the first normal array NA1 and with two bit lines disposed in the first dummy array DA1. Each of the plurality of sense amplifiers SA 211-213 of the first sense amplifier array 210 may compare and amplify a voltage provided from one bit line disposed in the first normal array NA1 and voltages provided from two bit lines disposed in the first dummy array DA1. Each of the plurality of sense amplifiers SA 221-223 of the second sense amplifier array 220 may be coupled with one bit line disposed in the first normal array NA1 and with one bit line disposed in the second normal array NA2. Each of the plurality of sense amplifiers SA 221-223 of the second sense amplifier array 220 may compare and amplify a voltage provided from one bit line disposed in the first normal array NA1 and a voltage provided from one bit line disposed in the second normal array NA2. Each of the plurality of sense amplifiers SA 231-233 of the third sense amplifier array 230 may be coupled with one bit line disposed in the k-th normal array NAk and with two bit lines disposed in the second dummy array DA2. Each of the plurality of sense amplifiers SA 231-233 of the third sense amplifier array 230 may compare and amplify a voltage provided from one bit line disposed in the k-th normal array NAk and voltages provided from two bit lines disposed in the second dummy array DA2.

A first sense amplifier 211 of the first sense amplifier array 210 may be coupled with a first bit line BL11 of the first normal array NA1 and first and second bit lines DBL11 and DBL12 of the first dummy array DA1. A second sense amplifier 212 of the first sense amplifier array 210 may be coupled with a third bit line BL13 of the first normal array NA1 and third and fourth bit lines DBL13 and DBL14 of the first dummy array DA1. A third sense amplifier 213 of the first sense amplifier array 210 may be coupled with a fifth bit line BL15 of the first normal array NA1 and fifth and sixth bit lines DBL15 and DBL16 of the first dummy array DA1.

A first sense amplifier 221 of the second sense amplifier array 220 may be coupled with a second bit line BL12 of the first normal array NA1 and a second bit line BL22 of the second normal array NA2. A second sense amplifier 222 of the second sense amplifier array 220 may be coupled with a fourth bit line BL14 of the first normal array NA1 and a fourth bit line BL24 of the second normal array NA2. A third sense amplifier 223 of the second sense amplifier array 220 may be coupled with a sixth bit line BL16 of the first normal array NA1 and a sixth bit line BL26 of the second normal array NA2. Although not shown, a first bit line BL21, a third bit line BL23 and a fifth bit line BL25 of the second normal array NA2 may be coupled with a subsequent sense amplifier array that is disposed adjacent to the second normal array NA2.

A first sense amplifier 231 of the third sense amplifier array 230 may be coupled with a second bit line BLk2 of the k-th normal array NAk and first and second bit lines DBL21 and DBL22 of the second dummy array DA2. A second sense amplifier 232 of the third sense amplifier array 230 may be coupled with a fourth bit line BLk4 of the k-th normal array NAk and third and fourth bit lines DBL23 and DBL24 of the second dummy array DA2. A third sense amplifier 233 of the third sense amplifier array 230 may be coupled with a sixth bit line BLk6 of the k-th normal array NAk and fifth and sixth bit lines DBL25 and DBL26 of the second dummy array DA2. A first bit line BLk1, a third bit line BLk3 and a fifth bit line BLk5 of the k-th normal array NAk may be coupled with a preceding sense amplifier array (not shown) that is disposed adjacent to the k-th normal array NAk.

In a memory bank having the open bit line structure described above, each sense amplifier array may perform an amplification operation using the bit lines of a corresponding one memory cell array as true lines and using the bit lines of an adjacent memory cell array as bar lines. Therefore, all of the bit lines of the first to k-th normal arrays NA1, NA2 and NAk may be coupled with the sense amplifiers of the sense amplifier arrays. However, a half of the bit lines of the first and second dummy arrays DA1 and DA2 that are disposed at the outermost portions may not be coupled to a sense amplifier array. In a memory bank, the second bit line DBL12, the fourth bit line DBL14 and the sixth bit line DBL16 of the first dummy array DA1 may not be coupled with sense amplifiers, and the first bit line DBL21, the third bit line DBL23 and the fifth bit line DBL25 of the second dummy array DA2 may not be coupled with sense amplifiers.

In the present embodiment, the second bit line DBL12 of the first dummy array DA1, along with the first bit line DBL11, may be coupled with the first sense amplifier 211 of the first sense amplifier array 210. The fourth bit line DBL14 along with the third bit line DBL13 may be coupled with the second sense amplifier 212 of the first sense amplifier array 210. The sixth bit line DBL16 along with the fifth bit line DBL15 may be coupled with the third sense amplifier 213 of the first sense amplifier array 210. The first and second bit lines DBL11 and DBL12 may be coupled in parallel with each other. The third and fourth bit lines DBL13 and DBL14 may be coupled in parallel with each other. The fifth and sixth bit lines DBL15 and DBL16 may be coupled in parallel with each other. Therefore, when one word line WL1 is enabled, memory cells MC coupled with the first and second bit lines DBL11 and DBL12 may be coupled with the first sense amplifier 211 at the same time. Likewise, memory cells MC that are coupled with the third and fourth bit lines DBL13 and DBL14 may be coupled with the second sense amplifier 212. Memory cells MC that are coupled with the fifth and sixth bit lines DBL15 and DBL16 may be coupled with the third sense amplifier 213.

Likewise, the first bit line DBL21 of the second dummy array DA2, along with the second bit line DBL22, may be coupled with the first sense amplifier 231 of the third sense amplifier array 230. The third bit line DBL23 along with the fourth bit line DBL24 may be coupled with the second sense amplifier 232 of the third sense amplifier array 230. The fifth bit line DBL25 along with the sixth bit line DBL26 may be coupled with the third sense amplifier 233 of the third sense amplifier array 230. The first and second bit lines DBL21 and DBL22 may be coupled in parallel with each other. The third and fourth bit lines DBL23 and DBL24 may be coupled in parallel with each other. The fifth and sixth bit lines DBL25 and DBL26 may be coupled in parallel with each other. In some embodiments, the bit lines of the first and second dummy arrays DA1 and DA2 that have not been used may be coupled in parallel with the corresponding sense amplifiers, whereby the sensing margin of the sense amplifiers may be ensured.

A sensing margin ΔV1 of a sense amplifier may be calculated by the following equation:

$$\Delta V1 = \frac{V_{CORE}}{2} * \frac{1}{1 + Cb/Cs} \quad (1)$$

wherein in Equation 1, $V_{CORE}$ denotes a sensing power voltage of the sense amplifier; Cb denotes a component of all parasitic capacitances related to the sense amplifier and has a value obtained by adding a parasitic capacitance component Cbl of the bit lines coupled with the sense amplifier and a capacitance component Csa by the sense amplifier array; and Cs denotes a capacitance component of the corresponding memory cells. In some embodiments, each of the sense amplifiers of the first and third sense amplifier arrays 210 and 230 coupled to the first and second dummy arrays DA1 and DA2 may be coupled with two bit lines disposed in the first or second dummy array DA1 and DA2. A sensing margin ΔV2 of each of the sense amplifiers 211, 212, 213, 231, 232 and 233 may be calculated by the following equation:

$$\Delta V2 = \frac{V_{CORE}}{2} * \frac{1}{1 + (2Cbl + Csa)/2Cs} \quad (2)$$

Wherein, in Equation 2, because the denominator is reduced by Csa/2Cs compared to that of Equation 1, the sensing margin ΔV2 calculated by Equation 2 is greater than the sensing margin ΔV1 calculated by Equation 1. Therefore, an additional sensing margin may be ensured, and the sense amplifier may sense more precise data. Furthermore, in the case where data of the normal array of each dummy array is sensed, two bit lines may be used as bar lines, so that the capacitance may be increased by the two bit lines, whereby a data reverse phenomenon due to coupling may be effectively prevented. Furthermore, the effect of noise reduction may be enhanced. In addition, even if either of two bit lines malfunctions, the other may store and sense data, thus making it possible to easily cope with failure of a memory cell.

While certain embodiments have been described above, it will be understood to those skilled in the art that the embodiments described are by way of example only. Accordingly, the semiconductor memory apparatus described herein should not be limited based on the described embodiments. Many other embodiments or variations of the invention may be envisaged by those skilled in the art to which this invention pertains without departing form the spirit and or scope of the invention defined by the appended claims.

What is claimed is:

1. A semiconductor memory apparatus comprising:
    a first dummy array disposed at a first portion of a memory bank;
    a first normal array disposed adjacent to the first dummy array; and
    a first sense amplifier array coupled in common between the first dummy array and the first normal array, the first sense amplifier array comprising a plurality of sense amplifiers,
    wherein each of the plurality of sense amplifiers is coupled with one bit line disposed in the first normal array and two bit lines disposed in the first dummy array, and the two bit lines disposed in the first dummy array are coupled in parallel with each of the plurality of sense amplifiers.

2. The semiconductor memory apparatus according to claim 1, wherein the first portion is an outermost portion of the memory bank.

3. The semiconductor memory apparatus according to claim 1, wherein the sense amplifier compares and amplifies a voltage level of the one bit line of the first normal array and voltage levels of the two bit lines of the first dummy array.

4. The semiconductor memory apparatus according to claim 1, further comprising:
    a second dummy array disposed at a second portion of the memory bank opposite to the first dummy array;
    a second normal array disposed adjacent to the second dummy array; and
    a second sense amplifier array coupled in common between the second dummy array and the second normal array, the second sense amplifier array comprising a plurality of sense amplifiers; and
    each of the plurality of sense amplifiers of the second sense amplifier array is coupled with one bit line disposed in the second normal array and two bit lines disposed in the second dummy array.

5. The semiconductor memory apparatus according to claim 4, wherein the second portion is an outermost portion of the memory bank opposite to the first dummy array.

6. The semiconductor memory apparatus according to claim 4, wherein the sense amplifier compares and amplifies a voltage level of the one bit line of the second normal array and voltage levels of the two bit lines of the second dummy array.

7. A semiconductor memory apparatus comprising:
    a first dummy array disposed at a first portion of a memory bank, the first dummy array comprising a first bit line and a second bit line;
    a first normal array disposed adjacent to the first dummy array, the first normal array comprising a first bit line; and
    a first sense amplifier coupled with the first and second bit lines of the first dummy array and with the first bit line of the first normal array,
    wherein the first and second bit lines of the first dummy array are coupled in parallel with the first sense amplifier.

8. The semiconductor memory apparatus according to claim 7, wherein the first portion is an outermost portion of the memory bank.

9. The semiconductor memory apparatus according to claim 7, wherein the first sense amplifier compares and amplifies voltage levels of the first and second bit lines of the first dummy array and a voltage level of the first bit line of the first normal array.

10. The semiconductor memory apparatus according to claim 7, further comprising:
    a second dummy array disposed at a second portion of the memory bank opposite to the first dummy array, the second dummy array comprising a first bit line and a second bit line;
    a second normal array disposed adjacent to the second dummy array, and comprising a first bit line; and
    a second sense amplifier coupled with the first and second bit lines of the second dummy array and with the first bit line of the second normal array.

11. The semiconductor memory apparatus according to claim 10, wherein the second portion is an outermost portion of the memory bank opposite to the first dummy array.

12. The semiconductor memory apparatus according to claim 10, wherein the first and second bit lines of the second dummy array are coupled in parallel with the second sense amplifier.

13. The semiconductor memory apparatus according to claim 12, wherein the second sense amplifier compares and amplifies voltage levels of the first and second bit lines of the second dummy array and a voltage level of the first bit line of the second normal array.

* * * * *